United States Patent
Treon et al.

(12)

(10) Patent No.: US 11,828,787 B2
(45) Date of Patent: Nov. 28, 2023

(54) EYE DIAGRAM CAPTURE TEST DURING PRODUCTION

(71) Applicant: Advantest Corporation, Tokyo (JP)

(72) Inventors: Justin Treon, San Jose, CA (US); Tien Pham, San Jose, CA (US)

(73) Assignee: Advantest Corporation, Tokyo (JP)

( * ) Notice: Subject to any disclaimer, the term of this patent is extended or adjusted under 35 U.S.C. 154(b) by 98 days.

(21) Appl. No.: 17/180,029

(22) Filed: Feb. 19, 2021

(65) Prior Publication Data
US 2021/0270888 A1 Sep. 2, 2021

Related U.S. Application Data

(60) Provisional application No. 62/983,127, filed on Feb. 28, 2020.

(51) Int. Cl.
*G01R 31/28* (2006.01)

(52) U.S. Cl.
CPC ..... *G01R 31/2836* (2013.01); *G01R 31/2834* (2013.01)

(58) Field of Classification Search
CPC ............ G01R 31/2836; G01R 31/2834; G01R 31/2882; G01R 29/02
See application file for complete search history.

(56) References Cited

U.S. PATENT DOCUMENTS

| | | | |
|---|---|---|---|
| 10,884,847 B1 * | 1/2021 | Champoux | G06F 7/584 |
| 2003/0112241 A1 * | 6/2003 | Fernando | G06T 11/206 |
| | | | 345/440 |
| 2004/0036494 A1 * | 2/2004 | Mak | G01R 29/26 |
| | | | 324/750.3 |
| 2007/0156360 A1 | 7/2007 | Romero | |
| 2009/0072845 A1 | 3/2009 | McCoy et al. | |
| 2010/0329322 A1 * | 12/2010 | Mobin | H04L 27/01 |
| | | | 375/231 |
| 2018/0196103 A1 * | 7/2018 | Champoux | G01R 31/31908 |
| 2018/0224502 A1 * | 8/2018 | Champoux | G01R 31/3177 |
| 2019/0187200 A1 * | 6/2019 | Gondi | H04B 17/15 |
| 2019/0305898 A1 * | 10/2019 | Mao | H04L 1/203 |
| 2019/0354453 A1 * | 11/2019 | Hsu | G06F 11/24 |
| 2019/0363813 A1 * | 11/2019 | Rell, III | H04J 3/0658 |
| 2019/0383873 A1 | 12/2019 | Hojabri et al. | |
| 2020/0025824 A1 * | 1/2020 | Zhao | G11C 29/022 |
| 2020/0250368 A1 * | 8/2020 | Froelich | H04L 43/50 |
| 2020/0285390 A1 * | 9/2020 | Champoux | G06F 3/0644 |
| 2020/0333396 A1 * | 10/2020 | Zhao | G01R 31/31709 |
| 2021/0116494 A1 * | 4/2021 | Champoux | G01R 31/2834 |
| 2021/0173010 A1 * | 6/2021 | Hsu | G01R 31/318314 |
| 2021/0270888 A1 * | 9/2021 | Treon | G01R 29/02 |
| 2021/0302498 A1 * | 9/2021 | Su | G01R 31/2884 |
| 2021/0405108 A1 * | 12/2021 | Strickling | G01R 31/2808 |
| 2021/0406144 A1 * | 12/2021 | Strickling | G06F 11/26 |
| 2022/0268839 A1 * | 8/2022 | Pickerd | G01R 31/31926 |

* cited by examiner

*Primary Examiner* — Manuel A Rivera Vargas
*Assistant Examiner* — Yaritza H Perez Bermudez (57) ABSTRACT

A method of testing a device comprises receiving signals from a device under test (DUT) and computing an eye diagram using the signals received from the DUT. The method also comprises comparing an eye height and an eye width of the eye diagram to a predetermined values of a threshold eye height and a threshold eye width. Further, responsive to a determination of the eye height and the eye width exceeding the predetermined values of the threshold eye height and the threshold eye width, flagging the DUT as passing.

20 Claims, 5 Drawing Sheets

EYE DIAGRAM CAPTURE TEST DURING PRODUCTION

CROSS-REFERENCE TO RELATED APPLICATIONS

This application also claims priority to U.S. Provisional Application 62/983,127, titled "EYE DIAGRAM CAPTURE TEST DURING PRODUCTION," by Justin TREON et al., filed on Feb. 28, 2020. The entire contents of each of the above-listed applications is hereby incorporated by reference for all purposes as if fully set forth herein.

FIELD OF THE INVENTION

The present disclosure relates generally to the field of electronic device testing systems and more specifically to the field of electronic device testing equipment for testing devices under test (DUTs).

BACKGROUND OF THE INVENTION

Automated test equipment (ATE) can be any testing assembly that performs a test on a semiconductor device or electronic assembly. ATE assemblies may be used to execute automated tests that quickly perform measurements and generate test results that can then be analyzed. An ATE assembly may be anything from a computer system coupled to a meter, to a complicated automated test assembly that may include a custom, dedicated computer control system and many different test instruments that are capable of automatically testing electronics parts and/or semiconductor wafer testing, such as system-on-chip (SOC) testing or integrated circuit testing. ATE systems both reduce the amount of time spent on testing devices (e.g., storage devices) to ensure that the device functions as designed and serve as a diagnostic tool to determine the presence of faulty components within a given device before it reaches the consumer.

Device manufacturers (e.g., Solid State Drive (SSD) device manufacturers) need to be able to identify when a storage device lane (or I/O channel) is bad or marginally bad when running production test flow. In conventional ATE systems, a production test flow will consist mostly of a tester being able to send and receive data to/from a device properly through I/O protocol such as PCIe or PCIe NVMe. As long as the I/O operation succeeds, production test flow will pass. However, in conventional test systems, it is not possible to know how much margin each of the passing device has since a device lane (or I/O channel) eye diagram is not available for production tests. As a consequence, there might be marginal devices with smaller lane eye diagrams that will pass production test, but will fail in the field when subject to different system host environments with less signal tolerance.

BRIEF SUMMARY OF THE INVENTION

Accordingly, a need exists for an apparatus and/or method that can address the problems with the approaches described above. Using the beneficial aspects of the apparatus and/or method described, without their respective limitations, embodiments of the present disclosure provide a novel solution to address these problems.

In particular, having the capability to capture the eye diagram for each device lane during production testing and having the ability to analyze the height and width of the eye diagram, on the fly, will help with filtering out marginal devices, preventing test escapes, and increasing device reliability. Embodiments of the present invention also allow a user to run an eye diagram test for each lane of the DUT in real-time test production. Further, embodiments of the present invention allow the user to pass/fail a device based on the eye height and eye width of the eye diagram measured against user limits.

In one embodiment, the eye diagram can be generated during production because it incorporates the embedded per-lane eye diagram capture ability in the ATE system (e.g., in a diagnostic tool programmed within, for example, an FPGA (Field Programmable Gate Array)) and customizes it to allow user the ability to set the eye height and width limits so that marginal bad devices can be filtered or binned out during a real-time production test. In one embodiment, the eye diagram test may be part of a production test flow during automated device testing.

In one embodiment, a method of testing a device is disclosed. The method comprises receiving signals from a device under test (DUT) and computing an eye diagram using the signals received from the DUT. Further, the method comprises comparing the computed eye height and the computed eye width of the eye diagram to a predetermined values of a threshold eye height and a threshold eye width. Also, responsive to a determination of the eye height and the eye width exceeding the predetermined values of the threshold eye height and the threshold eye width, the method comprises flagging the DUT as passing.

In another embodiment, an apparatus for testing a device under test (DUT) is disclosed. The apparatus comprises a programmable logic device coupled a device under test, wherein the programmable logic device is configured to: a) receive signals from a device under test (DUT); b) compute an eye diagram using the signals received from the DUT; c) compare an eye height and an eye width of the eye diagram to a predetermined values of a threshold eye height and a threshold eye width; and d) responsive to a determination of the eye height and the eye width exceeding the predetermined values of the threshold eye height and the threshold eye width, flagging the DUT as passing.

In one embodiment, a method for testing a device under test (DUT) comprises configuring a production test flow to capture an eye diagram for each device lane associated with a DUT, wherein the production test flow comprises receiving signals from a plurality of devices under test (DUTs) to a tester system, wherein each DUT communicates with the tester system using a respective device lane. The method also comprises displaying an eye diagram associated with a respective device lane to a user of the tester system, wherein the eye diagram is operable to be analyzed by the user to determine a margin of error corresponding to a respective DUT associated with the respective device lane.

The following detailed description together with the accompanying drawings will provide a better understanding of the nature and advantages of the present invention.

BRIEF DESCRIPTION OF THE DRAWINGS

Embodiments of the present invention are illustrated by way of example, and not by way of limitation, in the figures of the accompanying drawings and in which like reference numerals refer to similar elements.

In the figures, elements having the same designation have the same or similar function.

DETAILED DESCRIPTION OF THE INVENTION

Reference will now be made in detail to the various embodiments of the present disclosure, examples of which are illustrated in the accompanying drawings. While described in conjunction with these embodiments, it will be understood that they are not intended to limit the disclosure to these embodiments. On the contrary, the disclosure is intended to cover alternatives, modifications and equivalents, which may be included within the spirit and scope of the disclosure as defined by the appended claims. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

Some portions of the detailed descriptions that follow are presented in terms of procedures, logic blocks, processing, and other symbolic representations of operations on data bits within a computer memory. These descriptions and representations are the means used by those skilled in the data processing arts to most effectively convey the substance of their work to others skilled in the art. In the present application, a procedure, logic block, process, or the like, is conceived to be a self-consistent sequence of steps or instructions leading to a desired result. The steps are those utilizing physical manipulations of physical quantities. Usually, although not necessarily, these quantities take the form of electrical or magnetic signals capable of being stored, transferred, combined, compared, and otherwise manipulated in a computer system. It has proven convenient at times, principally for reasons of common usage, to refer to these signals as transactions, bits, values, elements, symbols, characters, samples, pixels, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present disclosure, discussions utilizing terms such as "configuring," "programming," "monitoring," "saving," "transmitting," or the like, refer to actions and processes (e.g., flowchart 500 of FIG. 5) of a computer system or similar electronic computing device or processor (e.g., system 110 of FIG. 1). The computer system or similar electronic computing device manipulates and transforms data represented as physical (electronic) quantities within the computer system memories, registers or other such information storage, transmission or display devices.

Embodiments described herein may be discussed in the general context of computer-executable instructions residing on some form of computer-readable storage medium, such as program modules, executed by one or more computers or other devices. By way of example, and not limitation, computer-readable storage media may comprise non-transitory computer-readable storage media and communication media; non-transitory computer-readable media include all computer-readable media except for a transitory, propagating signal. Generally, program modules include routines, programs, objects, components, data structures, etc., that perform particular tasks or implement particular abstract data types. The functionality of the program modules may be combined or distributed as desired in various embodiments.

Computer storage media includes volatile and nonvolatile, removable and non-removable media implemented in any method or technology for storage of information such as computer-readable instructions, data structures, program modules or other data. Computer storage media includes, but is not limited to, random access memory (RAM), read only memory (ROM), electrically erasable programmable ROM (EEPROM), flash memory or other memory technology, compact disk ROM (CD-ROM), digital versatile disks (DVDs) or other optical storage, magnetic cassettes, magnetic tape, magnetic disk storage or other magnetic storage devices, or any other medium that can be used to store the desired information and that can accessed to retrieve that information.

Communication media can embody computer-executable instructions, data structures, and program modules, and includes any information delivery media. By way of example, and not limitation, communication media includes wired media such as a wired network or direct-wired connection, and wireless media such as acoustic, radio frequency (RF), infrared, and other wireless media. Combinations of any of the above can also be included within the scope of computer-readable media.

Figure 1:
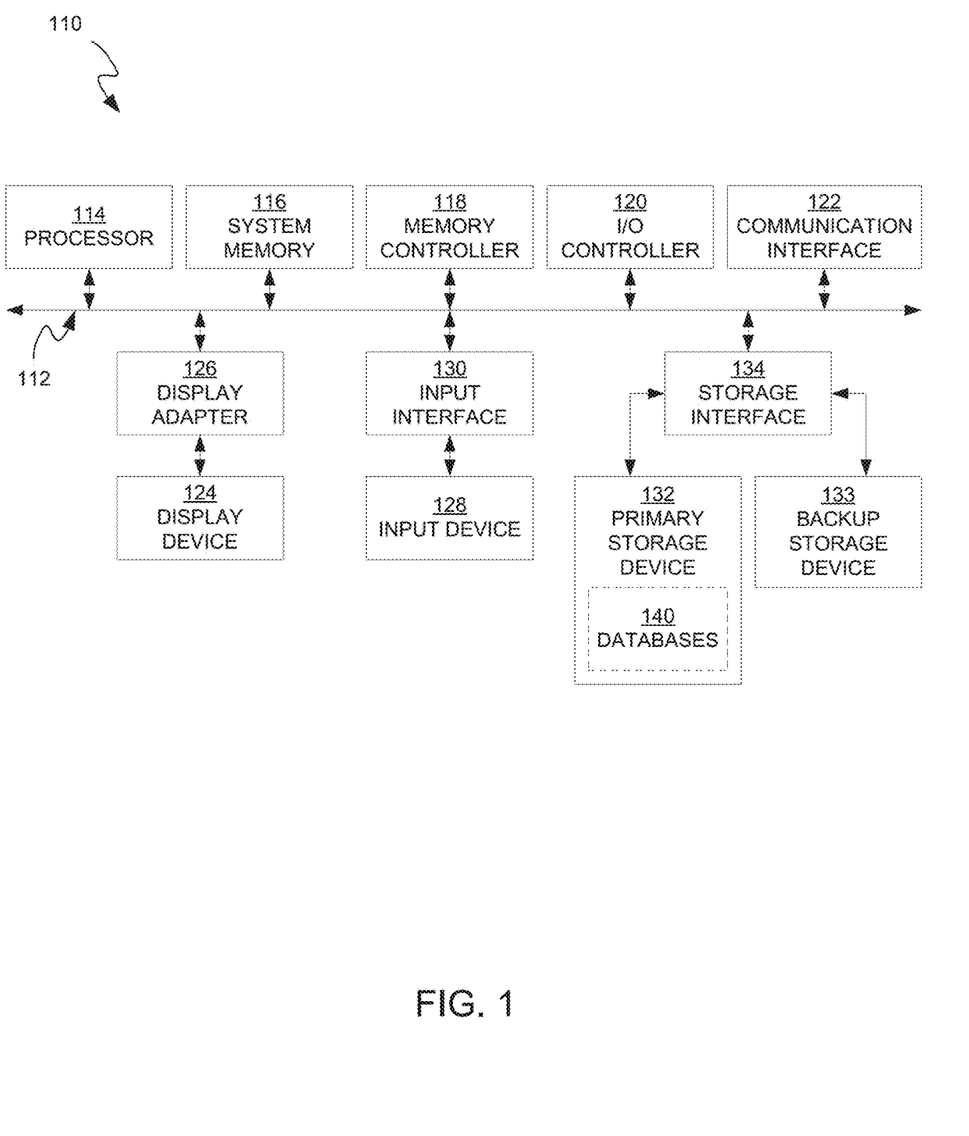
FIG. 1 is a block diagram of an example of a tester control system capable of supporting hardware and software-based diagnostic tools that help to analyze the height and width of an eye diagram captured in real-time from a device under test.

FIG. 1 is a block diagram of an example of a tester control system 110 capable of supporting hardware and software-based diagnostic tools that help to analyze the height and width of an eye diagram captured in real-time from a device under test. For example, system 110 may connect to FPGA-based tester modules, wherein the FPGAs comprise capture logic to collect information pertaining to the state of the tester and to the information being exchanged between the respective FPGAs and connected DUTs. Tester control system 110 broadly represents any single or multi-processor computing device or system capable of executing computer-readable instructions. Examples of control system 110 include, without limitation, workstations, laptops, client-side terminals, servers, distributed computing systems, handheld devices, or any other computing system or device. In its most basic configuration, control system 110 may include at least one processor 114 and a system memory 116.

Processor 114 generally represents any type or form of processing unit capable of processing data or interpreting and executing instructions. In certain embodiments, processor 114 may receive instructions from a software application or module. These instructions may cause processor 114 to perform the functions of one or more of the example embodiments described and/or illustrated herein.

System memory 116 generally represents any type or form of volatile or non-volatile storage device or medium capable of storing data and/or other computer-readable instructions. Examples of system memory 116 include, without limitation, RAM, ROM, flash memory, or any other suitable memory device. Although not required, in certain embodiments control system 110 may include both a volatile memory unit (such as, for example, system memory 116) and a non-volatile storage device (such as, for example, primary storage device 132).

Tester control system 110 may also include one or more components or elements in addition to processor 114 and system memory 116. For example, in the embodiment of FIG. 1, control system 110 includes a memory controller 118, an input/output (I/O) controller 120, and a communication interface 122, each of which may be interconnected via a communication infrastructure 112. Communication infrastructure 112 generally represents any type or form of infrastructure capable of facilitating communication between one or more components of a computing device. Examples of communication infrastructure 112 include, without limitation, a communication bus (such as an Industry Standard Architecture (ISA), Peripheral Component Interconnect (PCI), PCI Express (PCIe), or similar bus) and a network.

Memory controller 118 generally represents any type or form of device capable of handling memory or data or controlling communication between one or more components of control system 110. For example, memory controller 118 may control communication between processor 114, system memory 116, and I/O controller 120 via communication infrastructure 112.

I/O controller 120 generally represents any type or form of module capable of coordinating and/or controlling the input and output functions of a computing device. For example, I/O controller 120 may control or facilitate transfer of data between one or more elements of control system 110, such as processor 114, system memory 116, communication interface 122, display adapter 126, input interface 130, and storage interface 134.

Communication interface 122 broadly represents any type or form of communication device or adapter capable of facilitating communication between example control system 110 and one or more additional devices. For example, communication interface 122 may facilitate communication between control system 110 and a private or public network including additional control systems. Examples of communication interface 122 include, without limitation, a wired network interface (such as a network interface card), a wireless network interface (such as a wireless network interface card), a modem, and any other suitable interface. In one embodiment, communication interface 122 provides a direct connection to a remote server via a direct link to a network, such as the Internet. Communication interface 122 may also indirectly provide such a connection through any other suitable connection.

Communication interface 122 may also represent a host adapter configured to facilitate communication between control system 110 and one or more additional network or storage devices via an external bus or communications channel. Examples of host adapters include, without limitation, Small Computer System Interface (SCSI) host adapters, Universal Serial Bus (USB) host adapters, IEEE (Institute of Electrical and Electronics Engineers) 1394 host adapters, Serial Advanced Technology Attachment (SATA) and External SATA (eSATA) host adapters, Advanced Technology Attachment (ATA) and Parallel ATA (PATA) host adapters, Fibre Channel interface adapters, Ethernet adapters, or the like. Communication interface 122 may also allow control system 110 to engage in distributed or remote computing. For example, communication interface 122 may receive instructions from a remote device or send instructions to a remote device for execution.

As illustrated in FIG. 1, control system 110 may also include at least one display device 124 coupled to communication infrastructure 112 via a display adapter 126. Display device 124 generally represents any type or form of device capable of visually displaying information forwarded by display adapter 126. Similarly, display adapter 126 generally represents any type or form of device configured to forward graphics, text, and other data for display on display device 124.

As illustrated in FIG. 1, control system 110 may also include at least one input device 128 coupled to communication infrastructure 112 via an input interface 130. Input device 128 generally represents any type or form of input device capable of providing input, either computer- or human-generated, to control system 110. Examples of input device 128 include, without limitation, a keyboard, a pointing device, a speech recognition device, or any other input device.

As illustrated in FIG. 1, control system 110 may also include a primary storage device 132 and a backup storage device 133 coupled to communication infrastructure 112 via a storage interface 134. Storage devices 132 and 133 generally represent any type or form of storage device or medium capable of storing data and/or other computer-readable instructions. For example, storage devices 132 and 133 may be a magnetic disk drive (e.g., a so-called hard drive), a floppy disk drive, a magnetic tape drive, an optical disk drive, a flash drive, or the like. Storage interface 134 generally represents any type or form of interface or device for transferring data between storage devices 132 and 133 and other components of control system 110.

In one example, databases 140 may be stored in primary storage device 132. Databases 140 may represent portions of a single database or computing device or it may represent multiple databases or computing devices. For example, databases 140 may represent (be stored on) a portion of control system 110 and/or portions of a network architecture. Alternatively, databases 140 may represent (be stored on) one or more physically separate devices capable of being accessed by a computing device, such as control system 110 and/or portions of network architecture 200.

Continuing with reference to FIG. 1, storage devices 132 and 133 may be configured to read from and/or write to a removable storage unit configured to store computer software, data, or other computer-readable information. Examples of suitable removable storage units include, without limitation, a floppy disk, a magnetic tape, an optical disk, a flash memory device, or the like. Storage devices 132 and 133 may also include other similar structures or devices for allowing computer software, data, or other computer-readable instructions to be loaded into control system 110. For example, storage devices 132 and 133 may be configured to read and write software, data, or other computer-readable information. Storage devices 132 and 133 may also be a part of control system 110 or may be separate devices accessed through other interface systems.

Many other devices or subsystems may be connected to control system 110. Conversely, all of the components and devices illustrated in FIG. 1 need not be present to practice the embodiments described herein. The devices and subsystems referenced above may also be interconnected in different ways from that shown in FIG. 1. Control system 110 may also employ any number of software, firmware, and/or hardware configurations. For example, the example embodiments disclosed herein may be encoded as a computer program (also referred to as computer software, software applications, computer-readable instructions, or computer control logic) on a computer-readable medium.

The computer-readable medium containing the computer program may be loaded into control system 110. All or a portion of the computer program stored on the computer-readable medium may then be stored in system memory 116 and/or various portions of storage devices 132 and 133. When executed by processor 114, a computer program loaded into control system 110 may cause processor 114 to perform and/or be a means for performing the functions of the example embodiments described and/or illustrated herein. Additionally or alternatively, the example embodiments described and/or illustrated herein may be implemented in firmware and/or hardware.

Eye Diagram Capture Test During Production

Figure 2:
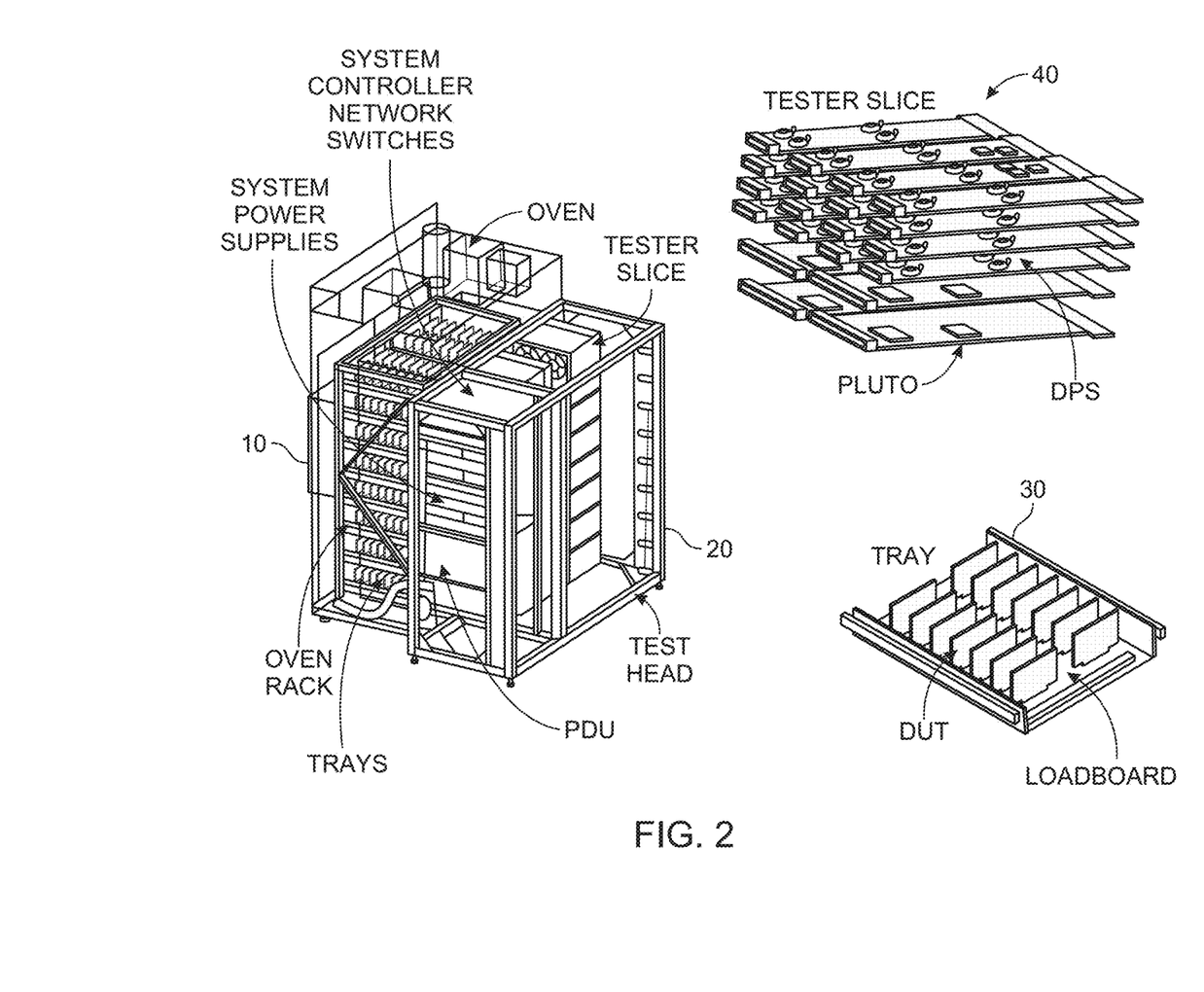
FIG. 2 illustrates an exemplary testing environment in which devices under test (DUTs) may be placed into a controlled environmental chamber.

FIG. 2 illustrates an exemplary testing environment in which devices under test (DUTs) may be placed into a controlled environmental chamber 10 or "oven." The DUTs are connected to tester slices of a test head 20. Many DUTs can be connected to a single tester slice 40. The tester slices contain the test circuitry, which performs tests on the DUTs in accordance with a test plan. In one embodiment, the test circuitry may include circuitry having the capability to capture the eye diagram for each device or DUT lane (or I/O channel) during production testing and having the ability to analyze the height and width of the eye diagram, on the fly.

There can be many tester slices per test head 20. The DUTs are placed into trays 30 when inserted into the oven 10. In a typical environmental chamber, the plurality of tester slices operate in lock step executing the same test plan on the plurality of DUTs. Further, the test head is typically controlled by a single controller computer system (e.g. tester control system 110) that is directly connected to the test head and, in this fashion, controls all of the slices of the test head 20. The controller computer is typically operated by a single user executing a single test plan on the DUTs.

As will be described further below, each tester slice comprises FPGAs onto which the diagnostic tool of the present invention can be programmed. The diagnostic tool programmed on the FPGA creates the eye diagram. In one embodiment, the eye is a representation of the manner in which the FPGA's receiver perceives the DUT's transmitted signal at the FPGA's receiver.

Figure 3:
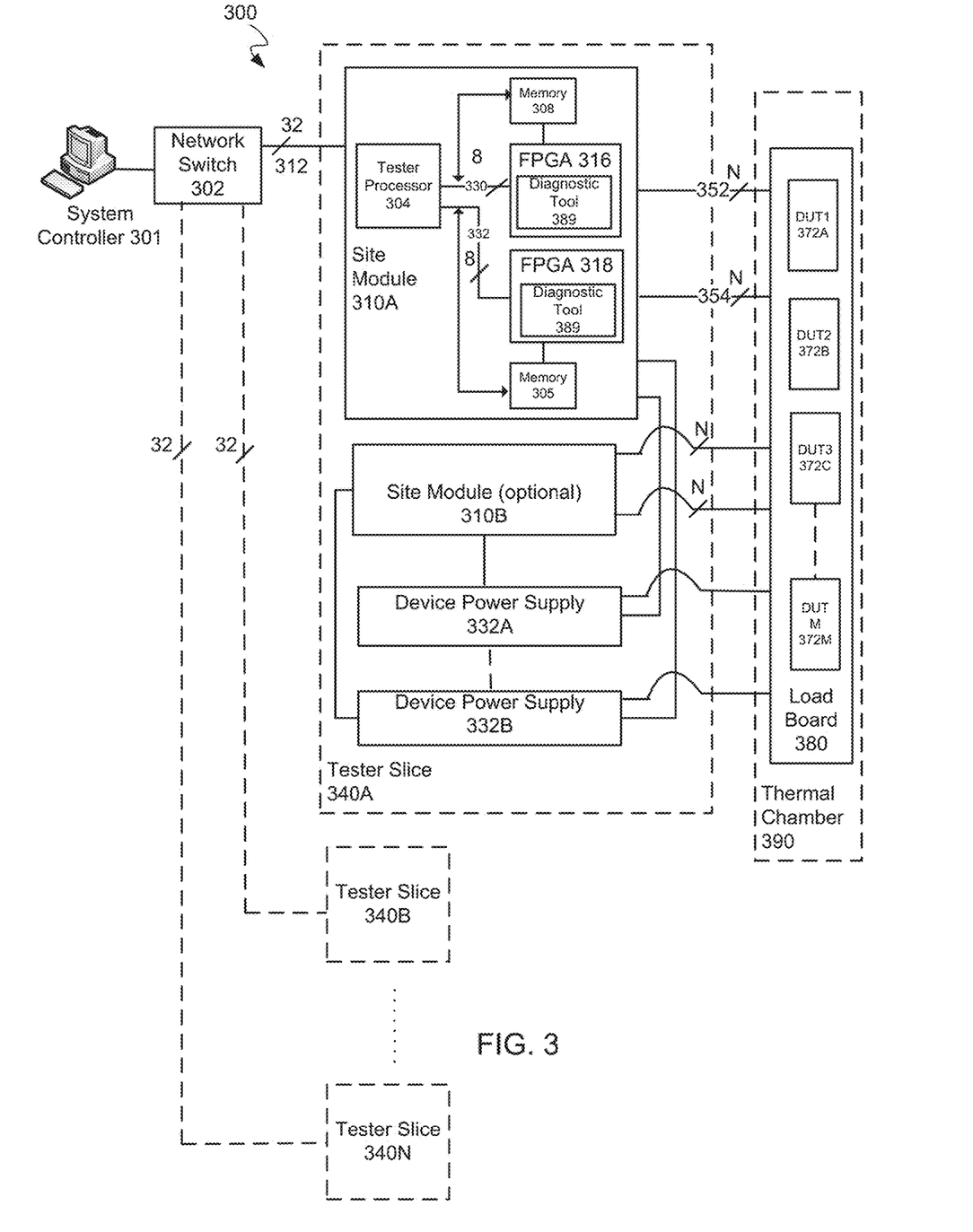
FIG. 3 is a detailed schematic block diagram illustrating an exemplary embodiment of a tester slice and its interconnections with the system controller and the DUTs.

FIG. 3 is a detailed schematic block diagram illustrating an exemplary embodiment of a tester slice and its interconnections with the system controller and the DUTs. It should be noted that the test system illustrated in FIG. 3 is exemplary and that embodiments of the present invention that capture eye diagrams based on signals received from one or more DUTs can be incorporated into any tester system.

Referring to FIG. 3, each tester slice comprises site modules. The site modules, in one embodiment, can be mechanically configured onto tester slices 340A-340N, wherein each tester slice comprises at least one site module. In certain typical embodiments, each tester slice can comprise two site modules and two device power supply boards. In other embodiments, the tester slice may comprise more or fewer site modules and/or power supply boards. Tester slice 340A of FIG. 3, for example, comprises site modules 310A and 3108 and device power supply boards 332A and 332B. However, there is no limit to the number of device power supply boards or site modules that can be configured onto a tester slice. Tester slice 340A is connected to system controller 301 through network switch 302. Network switch 302 can be connected to each of the site modules with a 32 bit wide bus.

In one embodiment, the system controller 301 may be a computer system, e.g., a personal computer (PC) that provides a user interface for the user of the ATE to load the test programs and run tests for the DUTs connected to the ATE 300. The Advantest Stylus Operating System is one example of test software normally used during device testing. It provides the user with a graphical user interface from which to configure and control the tests. It can also comprise functionality to control the test flow, control the status of the test program, determine which test program is running, and log test results and other data related to test flow. In one embodiment, the system controller can be connected to and control as many as 512 DUTs.

In one embodiment, the system controller 301 can be connected to the site module boards 310A-310B through a network switch, such as an Ethernet switch. In other embodiments, the network switch may be compatible with a different protocol such as Fibre Channel, 802.11 or ATM, for instance.

Each of the device power supply boards 332A-332B can be controlled from one of the site modules 310A-310B. The software running on the tester processor 304 can be configured to assign a device power supply to a particular site module. In one embodiment, the site modules 310A-310B and the device power supplies 332A-332B are configured to communicate with each other using a high speed serial protocol, e.g., Peripheral Component Interconnect Express (PCIe), Serial AT Attachment (SATA) or Serial Attached SCSI (SAS), for instance.

In one embodiment, each site module is configured with two FPGAs as shown in FIG. 3. Each of the FPGAs 316 and 318 in the embodiment of FIG. 3 is controlled by the tester processor 304. The tester processor 304 can communicate with each of the FPGAs using a 8 lane high speed serial protocol interface such as PCIe as indicated by system buses 330 and 332 in FIG. 3. In other embodiments, the tester processor 304 could also communicate with the FPGAs using different high speed serial protocols, e.g., Serial AT Attachment (SATA) or Serial Attached SCSI (SAS).

FPGAs 316 and 318 are connected to memory modules 308 and 305 respectively. The memory modules can be coupled with and can be controlled by both the FPGA devices and the tester processor 304.

FPGAs 316 and 318 can be connected to the DUTs 372A-372M on the load board 380 through buses 352 and 354 respectively. The load board 380 is a physical harness that allows a general purpose high speed connection at the site module end that is agnostic to the protocol used to communicate to the DUTs in on lines 352 and 354. At the DUT end, however, the load board needs to be designed so as to have connectors specific to the protocol being used by the DUT.

It should be noted that FIG. 3 only illustrates an exemplary embodiment of a tester slice. Further, note that embodiments of the present invention are not limited to only the type of tester slices shown in FIG. 3. Embodiments of the present invention can include many different types of tester slices and primitives. Each tester slice will, however, comprise FPGAs onto which a diagnostic tool 389 that creates an eye diagram may be programmed in accordance with embodiments of the present invention. In one embodiment, the diagnostic tool 389 may be a combination of FPGA hardware, programmable FPGA logic and software that is used together to capture an eye pattern from a DUT.

The DUTs 372A-372M, in one embodiment of the invention, are loaded on a load board 380 that is placed inside a thermal chamber 390 for testing. The DUTs 372A-372M and the load board 380 derive power from the device power supplies 332A and 332B.

The number of DUTs that can be connected to each FPGA is contingent on the number of transceivers in the FPGA and the number of I/O channels or lanes required by each DUT. In one embodiment, FPGAs 316 and 318 can each comprise 32 high speed transceivers and buses 352 and 354 can each be 32 bits wide, however, more or less can be implemented depending on the application. If each DUT requires 8 I/O lanes, for example, only 4 DUTs can be connected to each FPGA in such a system.

The tester processor 304 is connected to and can communicate with the system controller 301 over bus 312. In one embodiment, tester processor 304 communicates with each of the FPGA devices 316 and 318 over a separate dedicated bus (e.g., 330 and 332 respectively). In one embodiment, tester processor 304 can control the testing of the DUTs 372A-372M transparently through the FPGAs with minimal processing functionality allocated to the FPGA devices. In this embodiment, the data traffic capacity of buses 330 and 332 can be exhausted rapidly because all the commands and data generated by the tester processor need to be communicated over the bus to the FPGA devices. In other embodiments, the tester processor 304 can share the processing load by allocating functionality to control the testing of the DUTs to the FPGA devices. In these embodiments, the traffic over buses 330 and 332 is reduced because the FPGA devices can generate their own commands and data.

In one embodiment, each of the FPGA devices, e.g., 316 and 318 is connected to its own dedicated memory block, e.g., 308 and 305. These memory blocks can, among other things, be utilized to store the test pattern data that is written out to the DUTs. In one embodiment, each of the FPGA devices can comprise two or more instantiated FPGA tester blocks (not shown) with functional modules for performing functions including implementation of communicative protocol engines and hardware accelerators.

Further, each of the DUTs 372A-372M in the system can be connected to a dedicated instantiated FPGA tester block in a "tester per DUT" configuration, wherein each DUT gets its own instantiated tester block. This allows separate test execution for each DUT. The hardware resources in such a configuration are designed in a manner to support individual DUTs with minimal hardware sharing. This configuration also allows many DUTs to be tested in parallel, where each DUT can be connected to its own dedicated FPGA tester block within the FPGA and be running a different test program. Note that each FPGA may be connected with and in communication with multiple DUTs simultaneously, where each DUT may communicate with a dedicated instantiated FPGA tester block within the FPGA.

The architecture of the embodiment of the present invention depicted in FIG. 3 has several advantages. First, the instantiated tester blocks can be configured to communicate with the DUTs in any protocols that the DUTs support. Accordingly, if DUTs with different protocol support need to be tested, they can be connected to the same system and the FPGAs can be reprogrammed with support for the associated protocols. As a result, one ATE body can be easily configured to test DUTs supporting many different types of protocols.

In one embodiment, new protocols can be downloaded and installed directly on the FPGAs via a simple bit-stream download from a cache on system controller 301 without any kind of hardware interactions. An FPGA will typically include a configurable interface core (or IP core) that is programmable to provide functionality of one or more protocol based interfaces for a DUT and is programmable to interface with the DUT. For example, the FPGAs 316 and 318 in the ATE apparatus will include an interface core that can be configured with the PCIe protocol to test PCIe devices initially and subsequently reconfigured via a software download to test SATA devices. Also, if a new protocol is released, the FPGAs can easily be configured with that protocol via a bit-stream download instead of having to physically switch all the hardware bus adapter cards in the system. Finally, if a non-standard protocol needs to be implemented, the FPGAs can nonetheless be configured to implement such a protocol.

In another embodiment, the FPGAs can be configured to run more than one communicative protocol, wherein these protocols also can be downloaded from system controller 301 and configured through software. In other words, each FPGA implements custom firmware and software images to implement the functionality of one or more PC based testers in a single chip. The required electrical signaling and protocol-based signaling is provided by on-chip IP cores in the FPGAs. As mentioned above, each FPGA is programmable with pre-verified interface or IP cores. This ensures compliance and compatibility according to a given interface standard. The programmable nature of the FPGA is utilized to optimize flexibility, cost, parallelism and upgradeabilty for storage testing applications from SSDs, HDDs and other protocol based storage devices.

For instance, an instantiated FPGA tester block within FPGA 316 can be configured to run the PCIe protocol while a different instantiated FPGA tester block within the same FPGA 316 can be configured to run the SATA protocol. This allows the tester hardware to test DUTs supporting different protocols simultaneously. FPGA 316 can now be connected to test a DUT that supports both PCIe and SATA protocols. Alternatively, it can be connected to test two different DUTs, one DUT supporting the PCIe protocol and the other DUT supporting the SATA protocol, where each instantiated functional module within the FPGA is configured with a protocol to test the respective DUT it is connect to.

In one embodiment, the interface or IP core in the FPGA may be acquired from a third party vendor but may require some customization to be compatible with the embodiments described herein. In one embodiment, the interface core provides two functions: a) wraps storage commands into a standard protocol for transmission over a physical channel; and 2) is the electrical signal generator and receiver.

Figure 4:
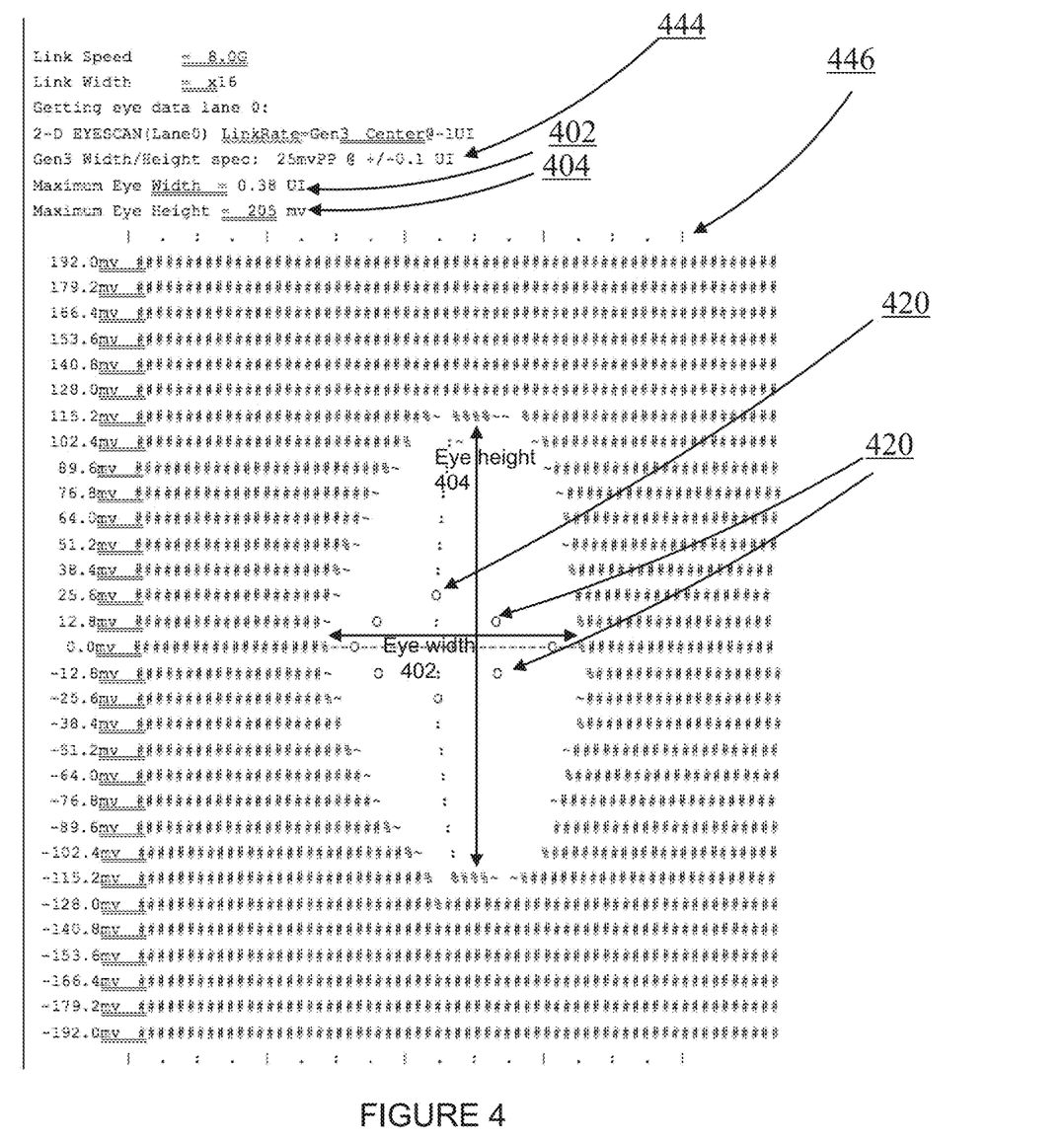
FIG. 4 illustrates an exemplary eye diagram that is captured by a diagnostic tool based on signals received from a DUT in accordance with an embodiment of the present invention.

FIG. 4 illustrates an exemplary eye diagram that can be captured by a diagnostic tool based on signals received from a DUT in accordance with an embodiment of the present invention. As noted above, the diagnostic tool may be programmed onto an FPGA, e.g., diagnostic tool 389 on FPGA 316 or FPGA 318. In one embodiment, the diagnostic tool 389 may be a combination of FPGA hardware, programmable FPGA logic and software that is used together to capture an eye pattern from a DUT. The diagnostic tool 389 has the capability to capture the eye diagram for each device lane on a DUT (e.g., DUT1 372A . . . DUT M 372M) during production testing and further has the ability to analyze the eye height and width of the eye diagram, on the fly. In one embodiment, the eye diagram test is part of a production test flow set up by a device manufacturer.

An eye diagram or an eye pattern is a representation in which digital signal from a receiver is repetitively sampled and applied to the vertical input, while the data rate is used to trigger the horizontal sweep. It is so called because, for several types of coding, the pattern looks like a series of eyes between a pair of rails. It is a tool for the evaluation of the combined effects of channel noise, dispersion and intersymbol interference on the performance of a transmission system.

FIG. 4 illustrates an exemplary eye diagram 446 created by a diagnostic tool 389 in an FPGA that comprises a certain eye height 404 and eye width 402. In one embodiment, an eye diagram similar to eye diagram 446 may be rendered for each lane of a connected DUT in real-time during production testing. The eye diagram may be rendered based on a feature embedded within the diagnostic tool 389. As mentioned above, the feature may be programmed within the diagnostic tool 389 using a combination of FPGA hardware, programmable FPGA logic and software. In one embodiment, testing the eye diagram may be part of a production test flow.

The diagnostic tool, in one embodiment, may be configured to compare the eye height 404 and eye width 402 of an eye diagram 446 rendered based on signals received from a DUT (and calculations thereof) with a specification required minimum eye diagram (represented in FIG. 4 using circles 420). The circles 420 associated with a specification required minimum eye diagram represents a minimum region the eye must encompass as required by a specification, e.g., the PCIe specification if the DUTs being tested are PCIe DUTs.

If the embedded per-lane eye diagram 446 exceeds the specification required eye diagram (represented by circles 420), as shown in FIG. 4, then the DUT is flagged as passing the test. However, if the eye height 404 or eye width 402 is narrower than the specification required eye diagram, the DUT is flagged as failing the test. In other words, an eye diagram that encroaches upon the eye mask (e.g., the specification required eye diagram) as outlined by circles 420 would be considered a "fail" and the corresponding DUT (associated with the lane for the failing eye diagram) may be flagged as a failing DUT. In one embodiment, the specification required eye diagram size can also be represented visually on the screen using circles 420 to enable a user to visually determine if the device passes or fails.

In one embodiment, the diagnostic tool 389 communicates to the tester processor 304 so that an error may be flagged to the user on system controller 301. In one embodiment, if all lanes on a DUT pass the test, no notification is generated for the user. However, if an eye diagram fails the test, a warning is generated for the user through system controller 301.

Note that neither the eye diagram 446 nor the specification required eye diagram need to be rendered on a screen in order for the diagnostic tool 389 to determine if a DUT passes or fails the test. In one embodiment, the diagnostic tool 389 may use the incoming signals from the DUT to internally generate the eye and automatically measure it in real-time to determine if it meets the specification requirements.

In one embodiment, the diagnostic tool 389 also allows the user the ability to set the eye height and width limits manually so that marginal bad devices can be filtered out or binned during a real-time production test. In a different embodiment, the eye height and width limits 444 (as shown in FIG. 4) may automatically be selected by the diagnostic tool based on a type of DUT being tested.

In one embodiment, the eye diagram 446 is computed and rendered based on signals received by the FPGA from a connected DUT. In other words, signals (e.g., test signals) transmitted from the DUT to the FPGA may be used to render the eye and determine if the respective DUT lane either passes or fails the test.

In another embodiment, an eye pattern may also be rendered for signals transmitted from the FPGA to the DUT. The eye may, for example, be created by sourcing a signal from the FPGA's transmitter and an external module (e.g., a passive loopback card) could loop the signal back to the FPGA's receiver. Thereafter, the diagnostic tool 389 could create an eye pattern based on the signals redirected to the FPGA's receiver. In this way an eye may be measured in both directions, for both the master and the slave device.

The eye diagrams advantageously help with filtering out (or binning) marginal devices, preventing test escapes, and increasing device reliability. Embodiments of the present invention also allow a user to run an eye diagram test for each lane of the DUT in real-time test production. Further, embodiments of the present invention allow the user to pass/fail a device based on the eye height and eye width of the eye diagram measured against user limits (e.g., based on a specification or user-programmed limits). In one embodiment, the DUT may be a solid state drive (SSD). However, in other embodiments, other types of devices, e.g., other PCIe compliant devices may also be tested.

In one embodiment, the eye diagram can advantageously be generated during production because it incorporates the embedded per-lane eye diagram capture ability in the ATE system (e.g., in a diagnostic tool programmed within, for example, an FPGA). Further, as mentioned above, the diagnostic tool allows users to advantageously customize the eye height and width limits so that marginal bad devices can be filtered out during a real-time production test.

Figure 5:
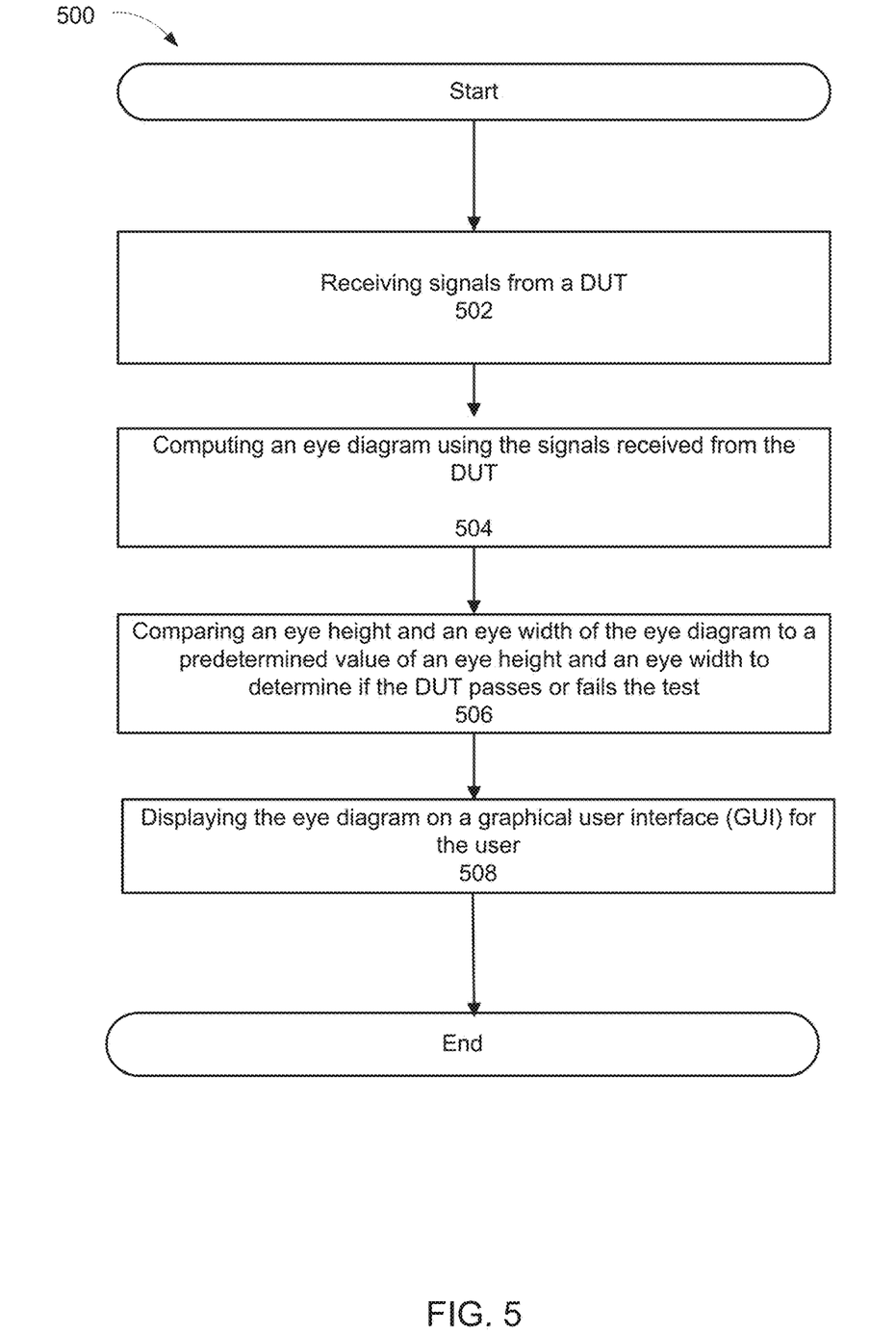
FIG. 5 illustrates a flowchart of an exemplary computer implemented process for using an eye diagram during production testing in accordance with one embodiment of the present invention.

FIG. 5 illustrates a flowchart of an exemplary computer implemented process for using an eye diagram during production testing in accordance with one embodiment of the present invention.

At step 502, signals from a DUT are received. The signals may, for example, be test signals that are configured for purposes of an eye diagram test.

At step 504, an eye diagram is computed in real-time using the signals received from the DUT. In one embodiment, the eye diagram is computed using hardware, software and logic circuitry configured within an FPGA.

At step 506, an eye height and an eye width of the eye diagram is automatically compared to a predetermined value of an eye height and an eye width in real-time to determine if the DUT passes or fails. The predetermined values may either be associated with the specification required eye diagram or may be user-determined.

At step 508, the eye diagram may be displayed on a graphical user interface (GUI) for a user. In one embodiment, the specification required eye diagram may also be displayed for a user to be able to visually determine if a DUT passes or fails the test. In one embodiment, displaying the eye diagram is optional and only eye diagrams for failing DUTs are displayed on the screen so a user can visually confirm that the DUT failed the eye-diagram test.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as may be suited to the particular use contemplated.

What is claimed is:

1. A method of electronically testing a device, the method comprising:
coupling a device under test (DUT) to a Field Programmable Gate Array (FPGA), wherein the FPGA comprises a plurality of instantiated tester blocks, wherein an instantiated tester block of the plurality of instantiated tester blocks is coupled to the DUT;
receiving signals from the DUT;
computing a measured eye diagram using the signals received from the DUT;
comparing an eye height and an eye width of the measured eye diagram to a minimum eye diagram;
responsive to a determination of the eye height or the eye width being narrower than a minimum eye diagram, flagging the DUT as failing; and
displaying the measured eye diagram and the minimum eye diagram at the same time through a graphical user interface (GUI);
wherein the receiving, the computing, the comparing, and the flagging are performed by the instantiated tester block within the FPGA.

2. The method of claim 1, further comprising:
responsive to a determination that the measured eye diagram exceeds the minimum eye diagram, flagging the DUT as passing;
wherein the flagging the DUT as passing is performed by the instantiated tester block.

3. The method of claim 1, further comprising:
after the displaying, receiving a user input pass/fail indication for the measured eye diagram.

4. The method of claim 1, wherein the minimum eye diagram corresponds to a specification required eye diagram.

5. The method of claim 1, wherein the displaying occurs in response to the flagging the DUT as failing.

6. The method of claim 1, wherein the displaying of the minimum eye diagram comprises utilizing a plurality of shapes.

7. The method of claim 1, wherein the measured eye diagram is associated with a single channel on the DUT.

8. The method of claim 1, wherein the computing, the comparing and the flagging are performed in real-time.

9. An apparatus for electronically testing a device under test (DUT), the apparatus comprising:
a Field Programmable Gate Array (FPGA) coupled a device under test (DUT), wherein the FPGA comprises a plurality of instantiated tester blocks, wherein an instantiated tester block of the plurality of instantiated tester blocks is coupled to the DUT, wherein the instantiated tester block within the FPGA is configured to:
receive signals from the DUT;
compute a measured eye diagram using the signals received from the DUT;
compare an eye height and an eye width of the measured eye diagram to a minimum eye diagram; and
responsive to a determination of the eye height or the eye width being narrower than a minimum eye diagram, flagging the DUT as failing, and
a display communicatively coupled to the FPGA, the FPGA is configured to display the measured eye diagram and the minimum eye diagram at the same time through a graphical user interface (GUI).

10. The apparatus of claim 9, wherein responsive to a determination of the measured eye diagram exceeds the minimum eye diagram, the instantiated tester block is further configured to flag the DUT as passing.

11. The apparatus of claim 9, wherein a second instantiated tester block of the plurality of instantiated tester blocks is coupled to a second DUT.

12. The apparatus of claim 9, wherein responsive to the flagging the DUT as failing, the FPGA is further configured to display the measured eye diagram and the minimum eye diagram at the same time through the GUI.

13. The apparatus of claim 9, wherein the minimum eye diagram corresponds to a specification required eye diagram.

14. The apparatus of claim 9, wherein the display of the minimum eye diagram comprises utilizing a plurality of shapes.

15. The apparatus of claim 9, wherein the measured eye diagram is associated with a single channel on the DUT.

16. A method for electronically testing a device under test (DUT), the method comprising:
configuring a production test flow to capture a measured eye diagram for each device lane associated with a DUT, wherein the production test flow comprises receiving signals from a plurality of devices under test (DUTs) to a tester system, wherein each DUT communicates with the tester system using a respective device lane;
computing the measured eye diagram using the signals received from the DUT;
comparing an eye height and an eye width of the measured eye diagram to a minimum eye diagram;
responsive to a determination of the eye height or the eye width being narrower than a minimum eye diagram, flagging the DUT as failing; and
displaying the measured eye diagram and the minimum eye diagram at the same time through a graphical user interface (GUI);
wherein the tester system comprising a Field Programmable Gate Array (FPGA), wherein the FPGA comprises a plurality of instantiated tester blocks, wherein a first instantiated tester block is coupled to a first DUT and a second instantiated tester block is coupled to a second DUT;
wherein the measured eye diagram is captured using an instantiated tester block within the FPGA.

17. The method of claim 16, wherein the displaying occurs in response to the flagging the DUT as failing.

18. The method of claim 16, further comprising:
after the displaying, receiving a user input pass/fail indication for the measured eye diagram.

19. The method of claim 16, wherein the minimum eye diagram corresponds to a specification required eye diagram.

20. The method of claim 16, further comprising:
responsive to a determination that the measured eye diagram exceeds the minimum eye diagram, flagging the DUT as passing;
wherein the flagging the DUT as passing is performed by the instantiated tester block.

* * * * *